United States Patent
Chang et al.

(10) Patent No.: US 11,495,287 B2
(45) Date of Patent: *Nov. 8, 2022

(54) MEMORY UNIT FOR MULTI-BIT CONVOLUTIONAL NEURAL NETWORK BASED COMPUTING-IN-MEMORY APPLICATIONS, MEMORY ARRAY STRUCTURE FOR MULTI-BIT CONVOLUTIONAL NEURAL NETWORK BASED COMPUTING-IN-MEMORY APPLICATIONS AND COMPUTING METHOD

(71) Applicant: NATIONAL TSING HUA UNIVERSITY, Hsinchu (TW)

(72) Inventors: Meng-Fan Chang, Taichung (TW); Yung-Ning Tu, Changhua County (TW); Xin Si, Hsinchu (TW); Wei-Hsing Huang, Taoyuan (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 509 days.

This patent is subject to a terminal disclaimer.

(21) Appl. No.: 16/664,970

(22) Filed: Oct. 28, 2019

(65) Prior Publication Data

US 2021/0125663 A1  Apr. 29, 2021

(51) Int. Cl.
| | | |
|---|---|---|
| G11C 11/00 | (2006.01) | |
| G11C 11/419 | (2006.01) | |
| G06N 3/063 | (2006.01) | |
| G06N 3/04 | (2006.01) | |
| G11C 11/412 | (2006.01) | |
| G11C 11/418 | (2006.01) | |

(52) U.S. Cl.
CPC .............. *G11C 11/419* (2013.01); *G06N 3/04* (2013.01); *G06N 3/063* (2013.01); *G11C 11/412* (2013.01); *G11C 11/418* (2013.01)

(58) Field of Classification Search
CPC ... G11C 11/419; G11C 11/412; G11C 7/1006; G11C 11/54; G06N 3/04; G06N 3/063; G06N 3/0454
USPC ........................................................ 365/154
See application file for complete search history.

(56) References Cited

U.S. PATENT DOCUMENTS

| | | | |
|---|---|---|---|
| 2003/0012067 A1* | 1/2003 | Wong ..................... | G11C 29/50 365/201 |
| 2020/0401710 A1* | 12/2020 | Wei ........................... | G06F 3/14 |
| 2021/0216846 A1* | 7/2021 | Chang ................... | G11C 11/412 |

* cited by examiner

*Primary Examiner* — Tha-O H Bui
(74) *Attorney, Agent, or Firm* — CKC & Partners Co., LLC

(57) ABSTRACT

A memory unit is controlled by a first word line and a second word line. The memory unit includes a memory cell and a transpose cell. The memory cell stores a weight. The memory cell is controlled by the first word line and includes a local bit line transmitting the weight. The transpose cell is connected to the memory cell and receives the weight via the local bit line. The transpose cell includes an input bit line, an input bit line bar, an output bit line and an output bit line bar. Each of the input bit line and the input bit line bar transmits a multi-bit input value, and the transpose cell is controlled by the second word line to generate a multi-bit output value on each of the output bit line and the output bit line bar according to the multi-bit input value and the weight.

20 Claims, 14 Drawing Sheets

MEMORY UNIT FOR MULTI-BIT CONVOLUTIONAL NEURAL NETWORK BASED COMPUTING-IN-MEMORY APPLICATIONS, MEMORY ARRAY STRUCTURE FOR MULTI-BIT CONVOLUTIONAL NEURAL NETWORK BASED COMPUTING-IN-MEMORY APPLICATIONS AND COMPUTING METHOD

BACKGROUND

Technical Field

The present disclosure relates to a memory unit, a memory array structure and a computing method thereof. More particularly, the present disclosure relates to a memory unit for multi-bit convolutional neural network (CNN) based computing-in-memory (CIM) applications, a memory array structure for multi-bit CNN based CIM applications and a computing method thereof.

Description of Related Art

In these years, due to the industrial growth of mobile device, medical electrical equipment, portable storage, etc., requirement of memory with low power, high speed and high density is increased. Computation-in-Memory (CIM) is a promising solution to improve the energy efficiency of multiplication-and-accumulation (MAC) operations for AI chips, and multiple-bit convolutional neural network (CNN) is required for high inference accuracy in many applications. However, MAC and logic computing in static random access memory (SRAM) CIM face challenges and tradeoffs in (1) It will cause write disturb issue when turning on a large number of word lines at the same time; (2) Threshold voltage (Vth) variations of SRAM cell will dominate the computation yield; (3) It will cause small sensing margin when multi-level sensing; and (4) High input precision is the bottleneck of previous CIM work. Accordingly, a memory unit for multi-bit CNN based CIM applications, a memory array structure for multi-bit CNN based CIM applications and a computing method thereof having the features of increasing sensing margin without causing the write disturb issue and saving energy and area are commercially desirable.

SUMMARY

According to one aspect of the present disclosure, a memory unit for multi-bit convolutional neural network (CNN) based computing-in-memory (CIM) applications is controlled by a first word line and a second word line. The memory unit for the multi-bit CNN based CIM applications includes at least one memory cell and a transpose cell. The at least one memory cell stores a weight. The at least one memory cell is controlled by the first word line and includes a local bit line transmitting the weight. The transpose cell is connected to the at least one memory cell and receives the weight via the local bit line. The transpose cell includes at least one input bit line, at least one input bit line bar, an output bit line and an output bit line bar. Each of the at least one input bit line and the at least one input bit line bar transmits at least one multi-bit input value, and the transpose cell is controlled by the second word line to generate a multi-bit output value on each of the output bit line and the output bit line bar according to the at least one multi-bit input value multiplied by the weight.

According to another aspect of the present disclosure, a memory array structure for multi-bit CNN based CIM applications is controlled by a first word line and a second word line. The memory array structure for the multi-bit CNN based CIM applications includes a plurality of memory units. The memory units are connected to each other via the first word line and the second word line. Each of the memory units includes at least one memory cell and a transpose cell. The at least one memory cell stores a weight. The at least one memory cell is controlled by the first word line and includes a local bit line transmitting the weight. The transpose cell is connected to the at least one memory cell and receives the weight via the local bit line. The transpose cell includes at least one input bit line, at least one input bit line bar, an output bit line and an output bit line bar. Each of the at least one input bit line and the at least one input bit line bar transmits at least one multi-bit input value, and the transpose cell is controlled by the second word line to generate a multi-bit output value on each of the output bit line and the output bit line bar according to the at least one multi-bit input value multiplied by the weight.

According to further another aspect of the present disclosure, a computing method of the memory array structure for the multi-bit CNN based CIM applications is controlled by the first word line and the second word line. The computing method includes voltage level applying step and a computing step. The voltage level applying step includes applying a plurality of voltage levels to the first word line, the second word line, the weight, the at least one input bit line and the at least one input bit line bar of each of the memory units, respectively. The computing step includes driving the transpose cell of each of the memory units to compute the voltage levels of the weight, the at least one input bit line and the at least one input bit line bar so as to generate the multi-bit output value on each of the output bit line and the output bit line bar according to the at least one multi-bit input value multiplied by the weight.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Before describing any embodiments in detail, some terms used in the following are described. A voltage level of "1" represents that the voltage is equal to a power supply voltage VDD. The voltage level of "0" represents that the voltage is equal to a ground voltage VSS. A PMOS transistor and an NMOS transistor represent a P-type MOS transistor and an N-type MOS transistor, respectively. Each transistor has a source, a drain and a gate.

Figure 1:
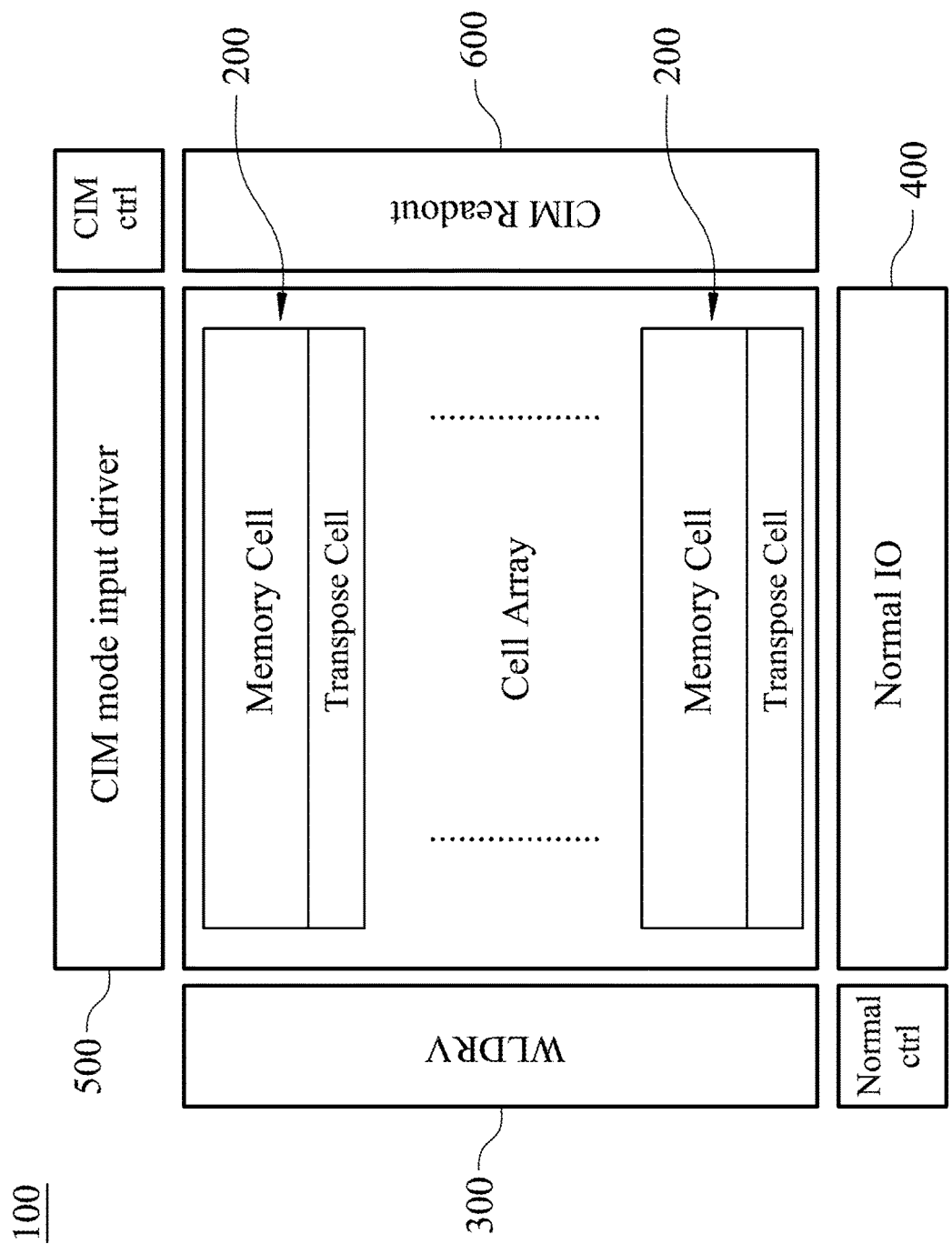
FIG. 1 shows a block diagram of a memory array structure for multi-bit convolutional neural network based computing-in-memory applications according to a first embodiment of the present disclosure.
Figure 2:
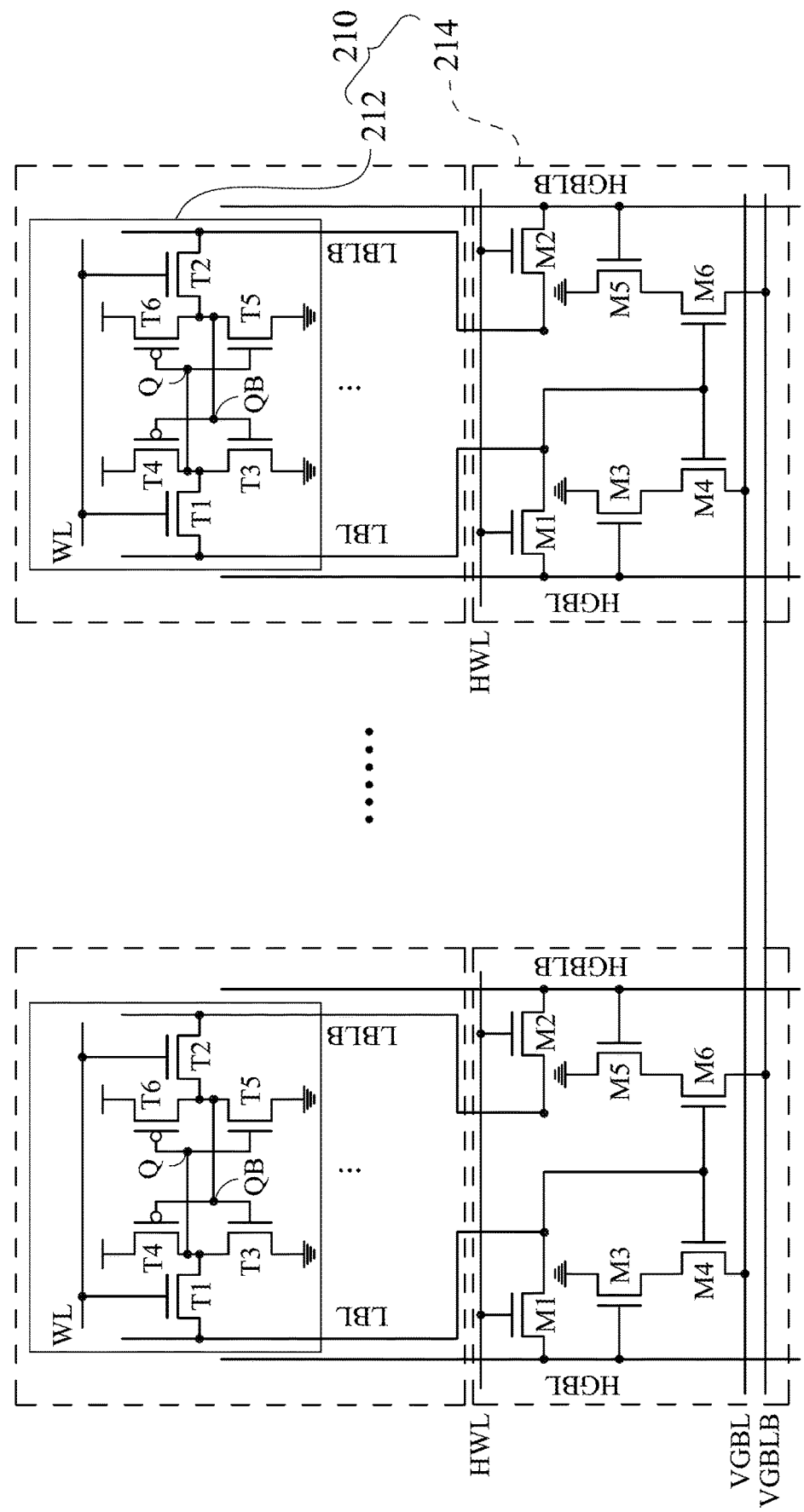
FIG. 2 shows a circuit diagram of a first type of a plurality of memory units of the memory array structure of FIG. 1.
Figure 3:
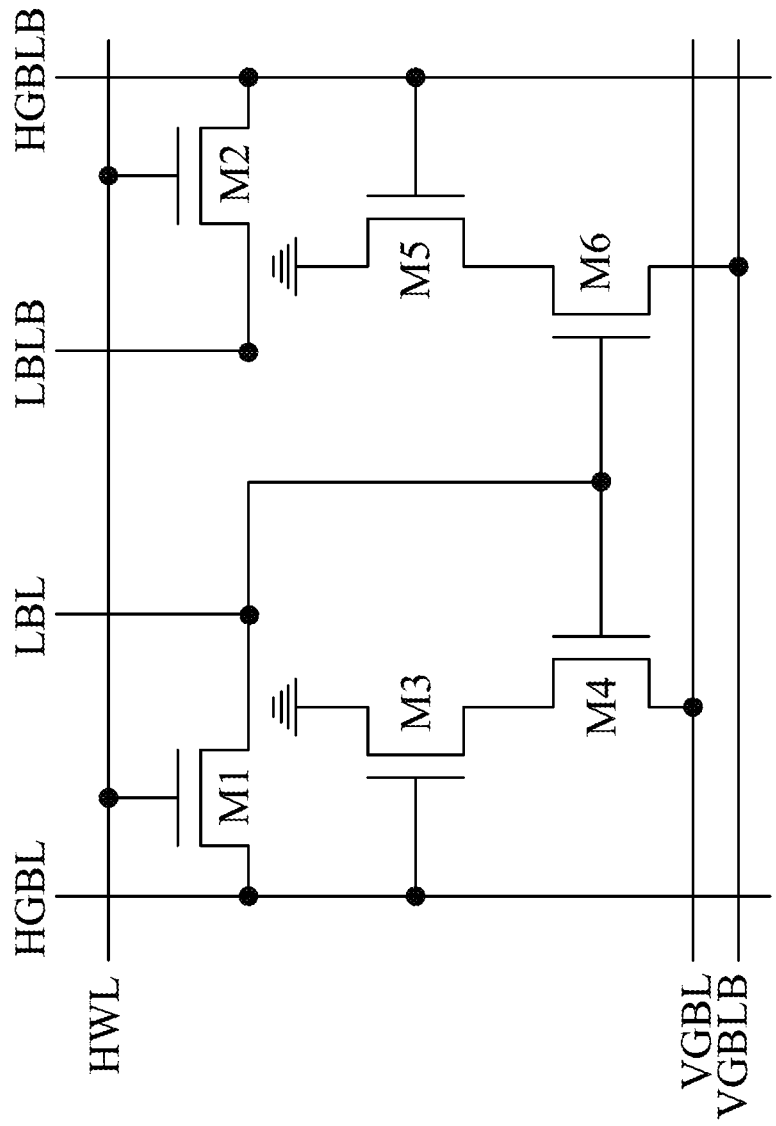
FIG. 3 shows a circuit diagram of a transpose cell of the first type of one of the memory units of the memory array structure of FIG. 2.
Figure 4:
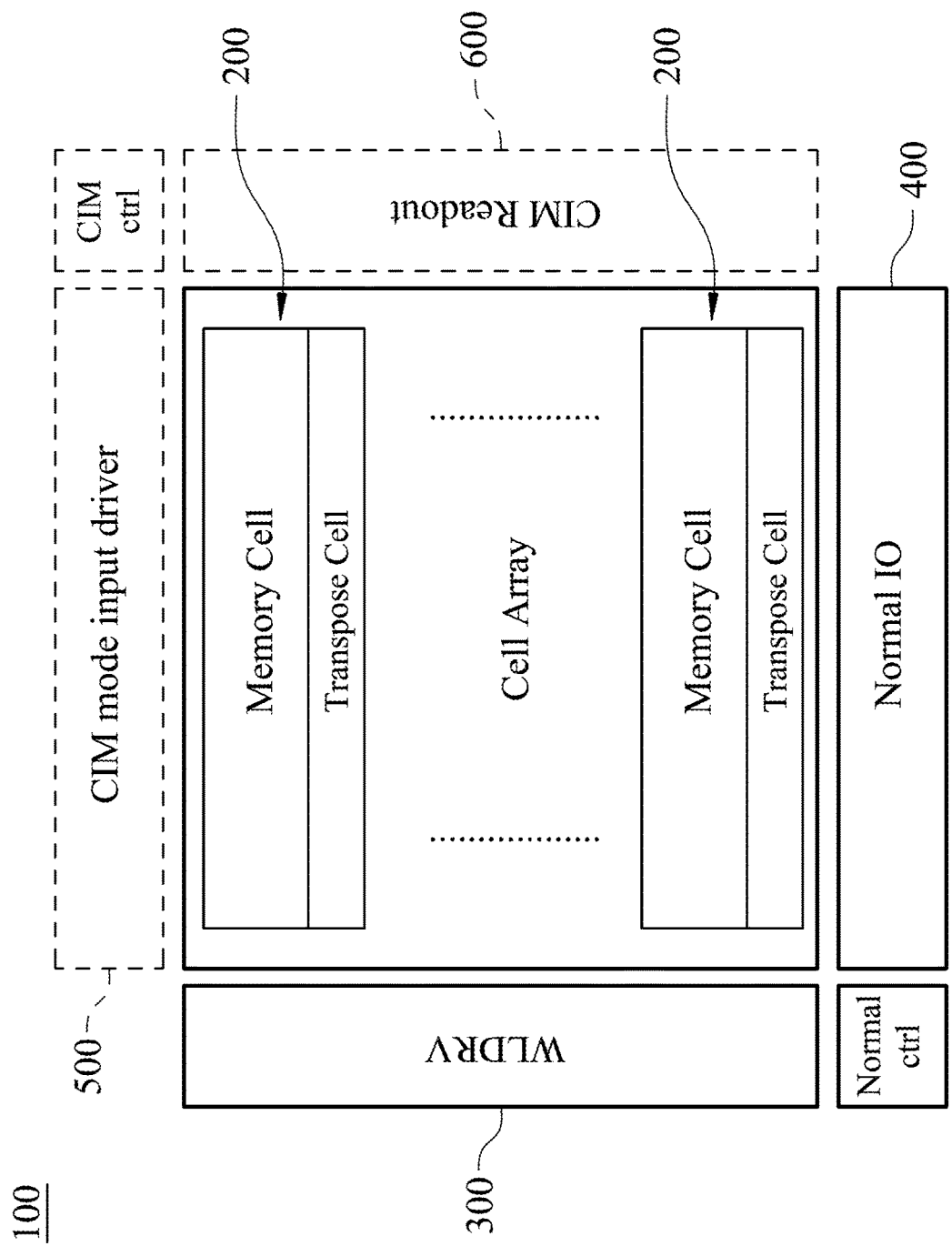
FIG. 4 shows one block diagram of the memory array structure for the multi-bit convolutional neural network based computing-in-memory applications of FIG. 1, which is in a normal mode.
Figure 5:
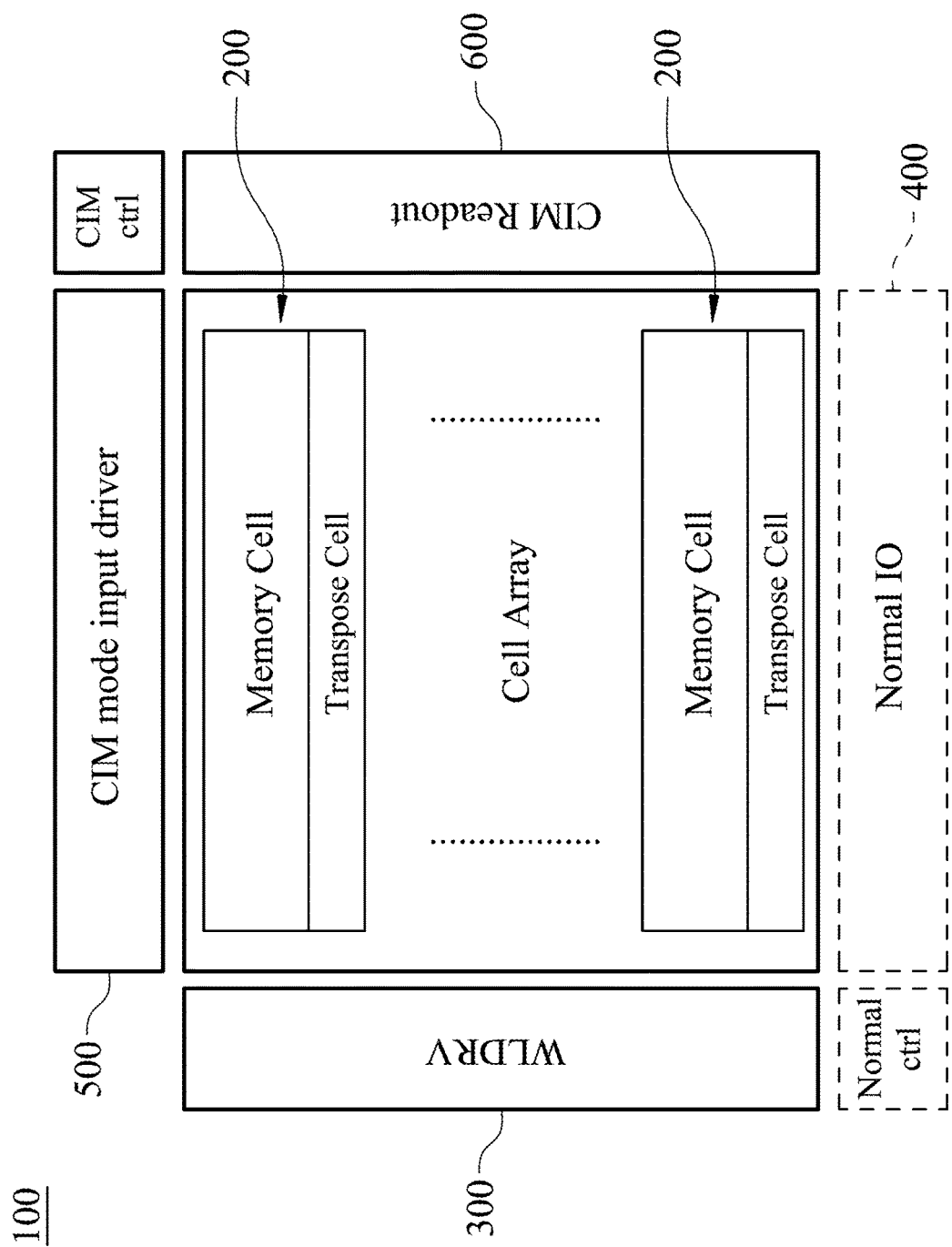
FIG. 5 shows another block diagram of the memory array structure for the multi-bit convolutional neural network based computing-in-memory applications of FIG. 1, which is in a computing-in-memory mode.
Figure 10:
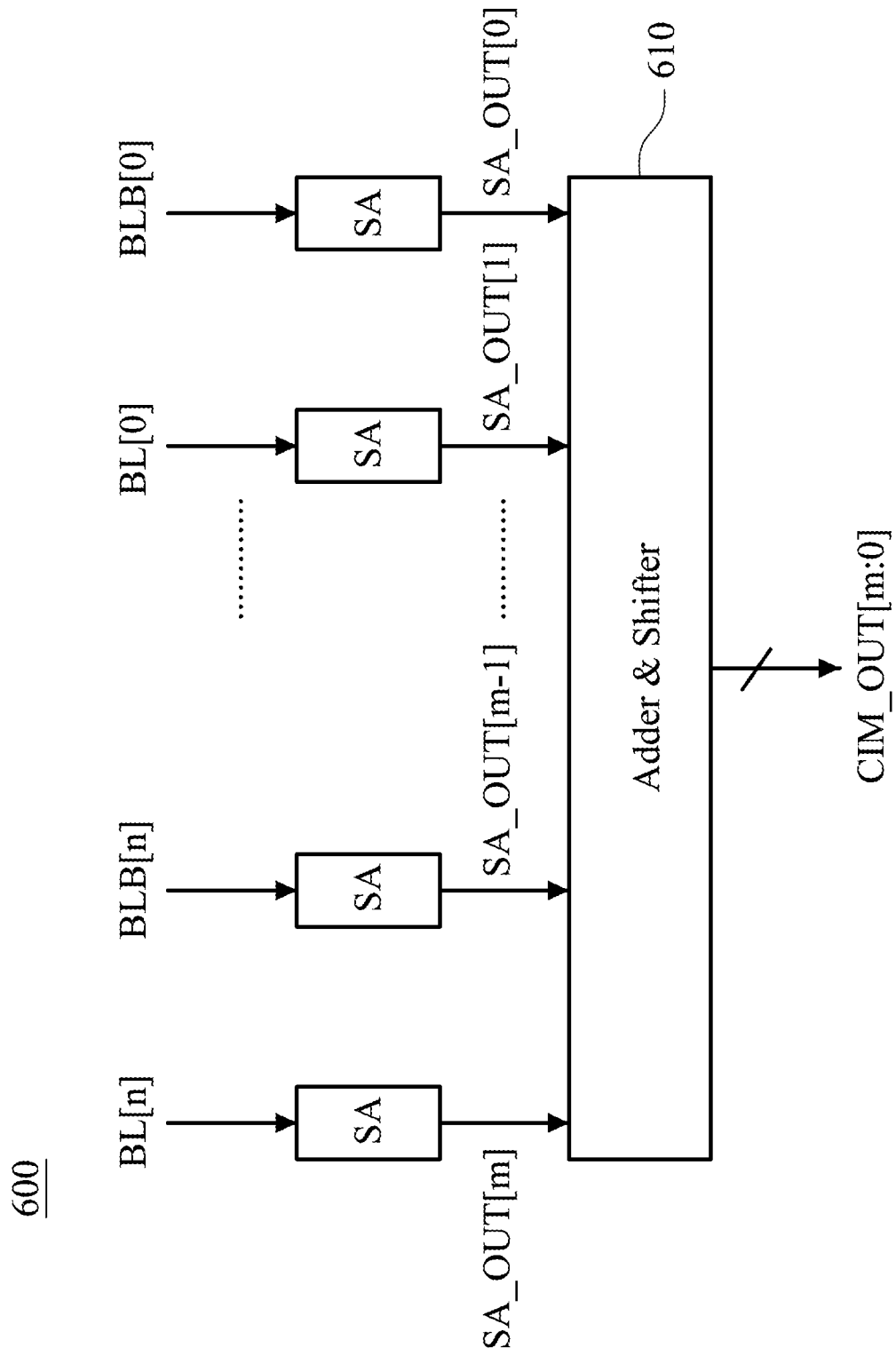
FIG. 10 shows a block diagram of a computing-in-memory readout circuit of the memory array structure for the multi-bit convolutional neural network based computing-in-memory applications of FIG. 1.

FIG. 1 shows a block diagram of a memory array structure 100 for multi-bit convolutional neural network (CNN) based computing-in-memory (CIM) applications according to a first embodiment of the present disclosure. FIG. 2 shows a circuit diagram of a first type of a plurality of memory units 210 of the memory array structure 100 of FIG. 1. FIG. 3 shows a circuit diagram of a transpose cell 214 of the first type of one of the memory units 210 of the memory array structure 100 of FIG. 2. FIG. 4 shows one block diagram of the memory array structure 100 for the multi-bit CNN based CIM applications of FIG. 1, which is in a normal mode. FIG. 5 shows another block diagram of the memory array structure 100 for the multi-bit CNN based CIM applications of FIG. 1, which is in a CIM mode. FIG. 10 shows a block diagram of a CIM readout circuit 600 of the memory array structure 100 for the multi-bit CNN based CIM applications of FIG. 1. In FIGS. 1-5 and 10, the memory array structure 100 for the multi-bit CNN based CIM applications is controlled by a first word line WL and a second word line HWL. The memory array structure 100 for the multi-bit CNN based CIM applications includes a plurality of local memory array units 200, a word line driver 300, a normal input-output (IO) circuit 400, a CIM mode input driver 500 and a CIM readout circuit 600.

The local memory array units 200 are connected to each other. Each of the local memory array units 200 includes the memory units 210. The memory units 210 are connected to each other via the first word line WL and the second word line HWL. Each of the memory units 210 includes at least one memory cell 212 and the transpose cell 214. In one embodiment, the number of the at least one memory cell 212 may be 16× (e.g., 16, 32, and so on).

The memory cell 212 stores a weight (1-bit weight). The memory cell 212 is controlled by the first word line WL. In detail, the memory cell 212 includes a first node Q, a second node QB, a local bit line BLB, a local bit line bar LBLB, a first memory cell transistor T1, a second memory cell transistor T2, a first inverter INV1 and a second inverter INV2. The first node Q stores the weight. The second node QB stores an inverted weight opposite to the weight of the first node Q. The local bit line BLB is connected to the transpose cell 214 and transmits the weight from the memory cell 212 to the transpose cell 214. The local bit line bar LBLB is connected to the transpose cell 214 and transmits the inverted weight from the memory cell 212 to the transpose cell 214. The first memory cell transistor T1 is connected to the first node Q, the local bit line LBL and the first word line WL. The second memory cell transistor T2 is connected to the second node QB, the local bit line bar LBLB and the first word line WL. The first inverter INV1 is located between the first node Q and the second node QB. The first inverter INV1 includes a third memory cell transistor T3 and a fourth memory cell transistor T4 connected to the third memory cell transistor T3. The second inverter INV2 is connected to the first inverter INV1. The second inverter INV2 includes a fifth memory cell transistor T5 and a sixth memory cell transistor T6 connected to the fifth memory cell transistor T5. In other words, the memory cell 212 is a 6T static random access memory (SRAM) cell. Each of the first memory cell transistor T1, the second memory cell transistor T2, the third memory cell transistor T3 and the fifth memory cell transistor T5 is the NMOS transistor. Each of the fourth memory cell transistor T4 and the sixth memory cell transistor T6 is the PMOS transistor.

The transpose cell 214 is connected to the memory cell 212 and receives the weight via the local bit line LBL. The transpose cell 214 includes an input bit line HGBL, an input bit line bar HGBLB, an output bit line VGBL and an output bit line bar VGBLB. Each of the input bit line HGBL and the input bit line bar HGBLB transmits a multi-bit input value, and the transpose cell 214 is controlled by the second word line HWL to generate a multi-bit output value on each of the output bit line VGBL and the output bit line bar VGBLB according to the multi-bit input value multiplied by the weight. In detail, the multi-bit input value of the input bit line HGBL is $V_{MSB}$ corresponding to Input<3:2>, and the multi-bit input value of the input bit line bar HGBLB is $V_{LSB}$ corresponding to Input<1:0>. The transpose cell 214 includes a first transpose cell transistor M1, a second transpose cell transistor M2, a third transpose cell transistor M3, a fourth transpose cell transistor M4, a fifth transpose cell transistor M5 and a sixth transpose cell transistor M6. The first transpose cell transistor M1 is connected to the second word line HWL, the input bit line HGBL and the local bit line LBL. The second transpose cell transistor M2 is connected to the second word line HWL, the input bit line bar HGBLB and the local bit line bar LBLB. The third transpose cell transistor M3 is connected to the ground voltage, the input bit line HGBL and a third node. The fourth transpose cell transistor M4 is connected to the third node, the local bit line LBL and the output bit line VGBL. The fifth transpose cell transistor M5 is connected to the ground voltage, the input bit line bar HGBLB and a fourth node. The sixth transpose cell transistor M6 is connected to the fourth node, the local bit line LBL and the output bit line bar VGBLB. In addition, the multi-bit input value is an analog signal. The input bit line HGBL and the input bit line bar HGBLB are extended in a vertical direction (column). The first word line WL, the second word line HWL, the output bit line VGBL and the output bit line bar VGBLB are extended in a horizontal direction (row). Each of the first transpose cell transistor M1, the second transpose cell transistor M2, the third transpose cell transistor M3, the fourth transpose cell transistor M4, the fifth transpose cell transistor M5 and the sixth transpose cell transistor M6 is the NMOS transistor. Table 1 lists the multi-bit input values, the weights and the multi-bit output values of the first type of the transpose cell 214 of FIG. 3. The multi-bit output values can be computed by the multi-bit input values and the weights. The multi-bit input values represent the voltage level ($V_{MSB}$) of the input bit line HGBL and the voltage level ($V_{LSB}$) of the input bit line bar HGBLB, respectively. The multi-bit input values are corresponding to Input<3:2> and Input<1:0>, respectively. Each of the input bit line HGBL and the input bit line bar HGBLB may have fourth voltage levels which are equal to VDD (e.g., 1.0 V), Vinput10 (e.g., 0.7 V), Vinput01 (e.g., 0.5 V) and VSS (0 V), respectively, i.e., each of the multi-bit input values may be VDD, Vinput10, Vinput01 or VSS. The weight is corresponding to the voltage level on the local bit line LBL. The multi-bit output values (i.e., "Input×Weight") are corresponding to currents on the output bit line VGBL and the output bit line bar VGBLB.

TABLE 1

| Input (Input<3:2>/Input<1:0>) | Input (HGBL/HGBLB) | Weight (LBL) | Input × Weight (VGBL/VGBLB) |
|---|---|---|---|
| 11 | VDD | 1 | 3 × Idis |
| 10 | Vinput10 | | 2 × Idis |
| 01 | Vinput01 | | 1 × Idis |
| 00 | VSS | | 0 |
| Don't care | Don't care | 0 | 0 |

The word line driver 300 is connected to each of the local memory array units 200 via the first word line WL and the second word line HWL. The word line driver 300 is represented by "WLDRV" and is located on a left side of the local memory array units 200. The word line driver 300 generates the voltage level of the first word line WL and the voltage level of the second word line HWL to control each of the local memory array units 200.

The normal IO circuit 400 is connected to each of the local memory array units 200 via the input bit line HGBL and the input bit line bar HGBLB. The normal IO circuit 400 is represented by "Normal IO" and is located on a bottom side of the local memory array units 200. The normal IO circuit 400 receives the weights from the local memory array units 200.

The CIM mode input driver 500 is connected to each of the local memory array units 200 via the input bit line HGBL and the input bit line bar HGBLB. The CIM mode input driver 500 is located on a top side of the local memory array units 200. The CIM mode input driver 500 generates the voltage level of the input bit line HGBL and the voltage level of the input bit line bar HGBLB according to the multi-bit input values (Input<3:2> and Input<1:0>), respectively.

The CIM readout circuit 600 is connected to each of the local memory array units 200 via the output bit line VGBL and the output bit line bar VGBLB. The CIM readout circuit 600 is represented by "CIM Readout" and is located on a right side of the local memory array units 200. The CIM readout circuit 600 receives the multi-bit output values from the local memory array units 200. In detail, the CIM readout circuit 600 includes a plurality of sense amplifiers SA and at least one adder-shifter circuit 610. In one embodiment of FIG. 10, the number of the sense amplifiers SA may be equal to 16, and the number of the at least one adder-shifter circuit 610 may be equal to 1. The sense amplifiers SA are connected to the output bit line VGBL and the output bit line bar VGBLB. Each of the sense amplifiers SA receives the multi-bit output value from one of the output bit line VGBL and the output bit line bar VGBLB, and each of the sense amplifiers SA transfers the multi-bit output value (e.g., BLB[0]) to a multi-bit digital output value (e.g., SA_OUT [0]). In addition, the adder-shifter circuit 610 is represented by "Adder & Shifter" and is connected to the sense amplifiers SA. The adder-shifter circuit 610 is configured to add and shift the multi-bit digital output values (SA_OUT[0]-SA_OUT[m]) of the sense amplifiers to generate a multi-bit CIM output signal (CIM_OUT[m:0]).

In the normal mode of FIGS. 2 and 4, the voltage level of the first word line WL and the voltage level of the second word line HWL are both equal to 1, so that the weight in the memory cell 212 may be transmitted to the input bit line HGBL via the local bit line LBL and the first transpose cell transistor M1, and the inverted weight may be transmitted to the input bit line bar HGBLB via the local bit line bar LBLB and the second transpose cell transistor M2. Then, the weight and the inverted weight may be transmitted from the local memory array unit 200 to the normal IO circuit 400 via the input bit line HGBL and the input bit line bar HGBLB.

In the CIM mode of FIGS. 2 and 5, the voltage level of the first word line WL and the voltage level of the second word line HWL are equal to 1 and 0, respectively, so that the first transpose cell transistor M1 and the second transpose cell transistor M2 are turned off. The weight in the memory cell 212 may be used to control the fourth transpose cell transistor M4 and the sixth transpose cell transistor M6. The voltage level of the input bit line HGBL and the voltage level of the input bit line bar HGBLB may be used to control the third transpose cell transistor M3 and the fifth transpose cell transistor M5, respectively. Accordingly, the multi-bit output values of the output bit line VGBL and the output bit line bar VGBLB can be generated according to the weights of the local bit line LBL of the word line driver 300 and the multi-bit input values of the input bit line HGBL and the input bit line bar HGBLB of the CIM mode input driver 500. Therefore, the memory unit for multi-bit CNN based CIM applications and the memory array structure for multi-bit CNN based CIM applications of the present disclosure can turn on a large number of word lines (e.g., the first word lines WL and the second word lines HWL) at the same time without causing the write disturb issue and decrease threshold voltage variations of SRAM cell.

Figure 6:
FIG. 6 shows a circuit diagram of a transpose cell of a second type of a memory unit of a memory array structure according to a second embodiment of the present disclosure.
Figure 7:
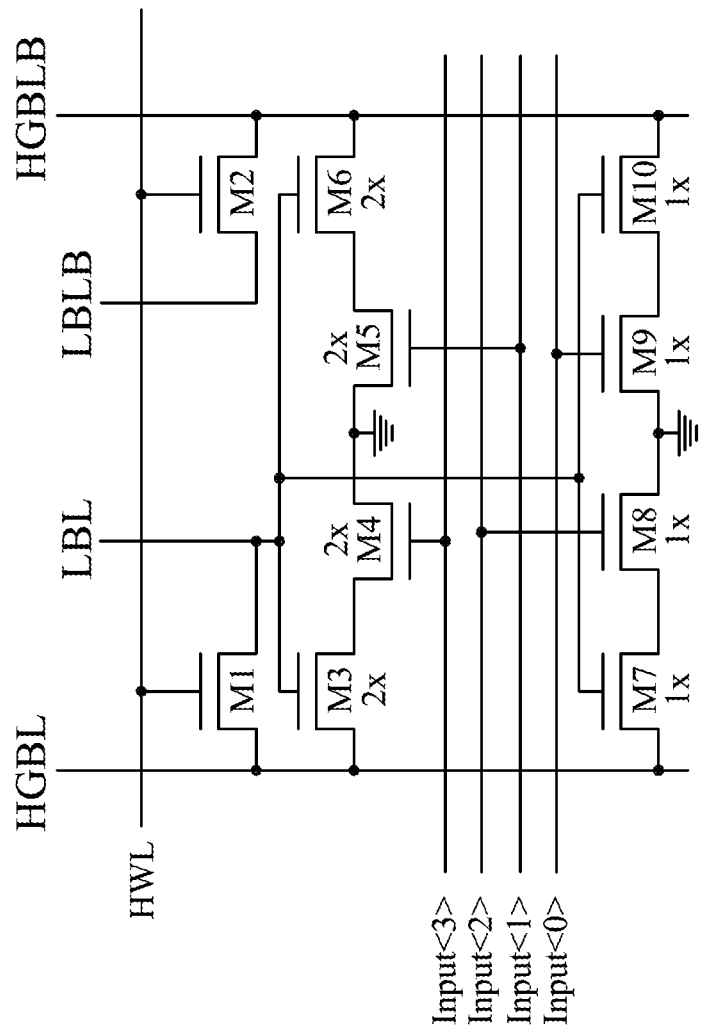
FIG. 7 shows a circuit diagram of a transpose cell of a third type of a memory unit of a memory array structure according to a third embodiment of the present disclosure.
Figure 8:
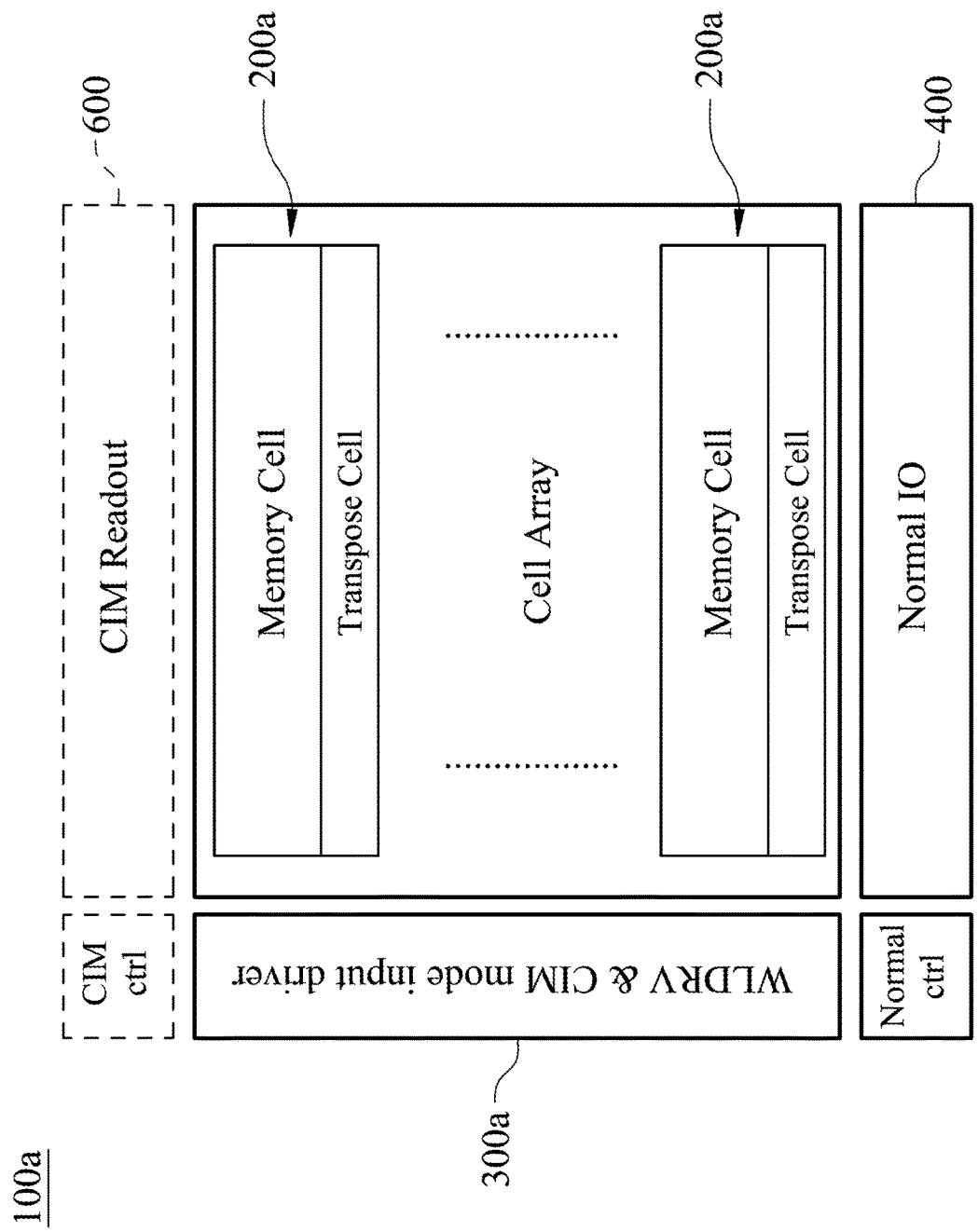
FIG. 8 shows a block diagram of the memory array structure for the multi-bit convolutional neural network based computing-in-memory applications of FIGS. 6 and 7, which is in a normal mode.
Figure 9:
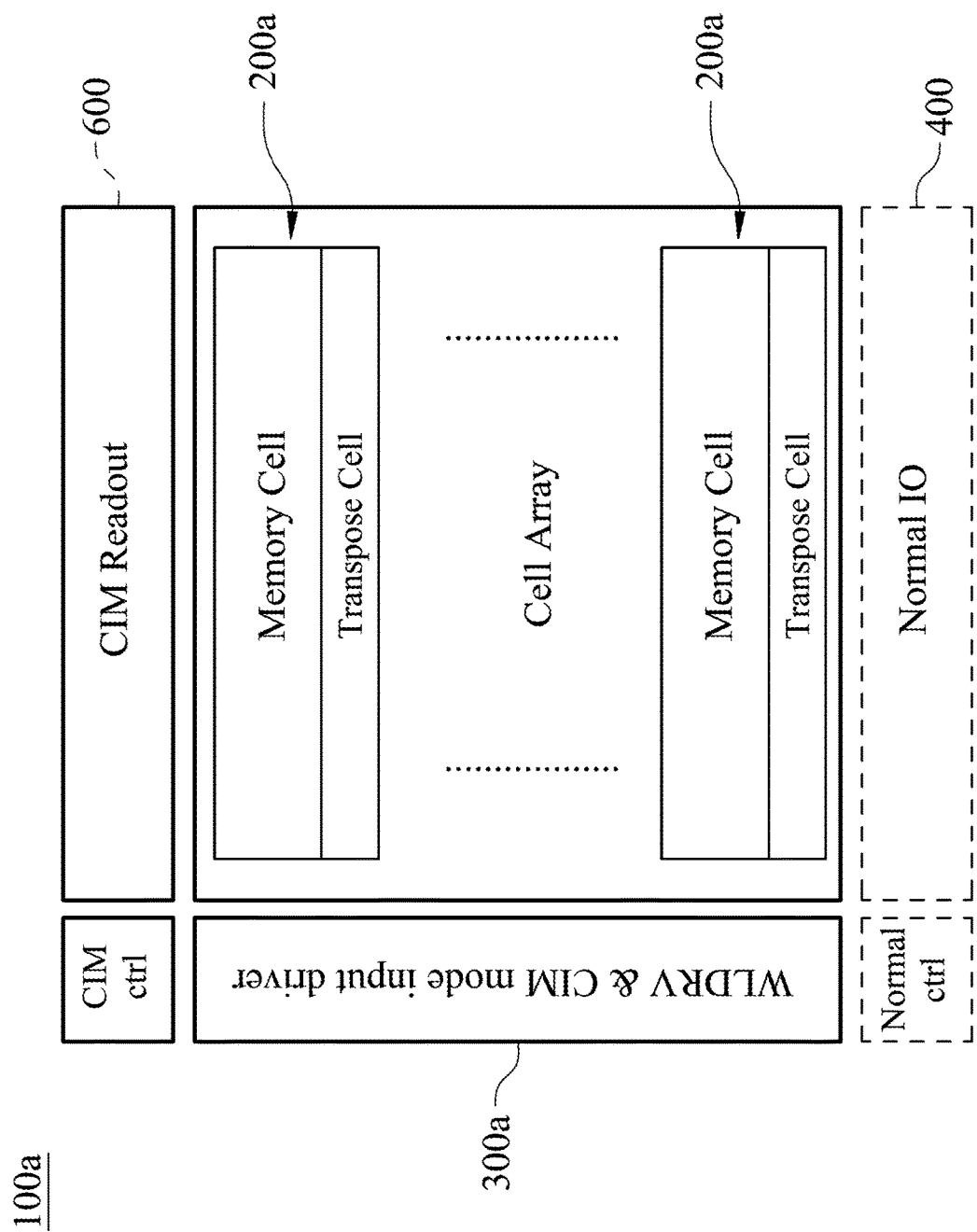
FIG. 9 shows a block diagram of the memory array structure for the multi-bit convolutional neural network based computing-in-memory applications of FIGS. 6 and 7, which is in a computing-in-memory mode.

FIG. 6 shows a circuit diagram of a transpose cell 214a of a second type of a memory unit 210a of a memory array structure 100a according to a second embodiment of the present disclosure. FIG. 7 shows a circuit diagram of a transpose cell 214b of a third type of a memory unit 210a of a memory array structure 100a according to a third embodiment of the present disclosure. FIG. 8 shows a block diagram of the memory array structure 100a for the multi-bit CNN based CIM applications of FIGS. 6 and 7, which is in a normal mode. FIG. 9 shows a block diagram of the memory array structure 100a for the multi-bit CNN based CIM applications of FIGS. 6 and 7, which is in a CIM mode. In FIGS. 7-9, the memory array structure 100a for the multi-bit CNN based CIM applications includes a plurality of local memory array units 200a, a word line driver 300a, a normal IO circuit 400 and a CIM readout circuit 600. The local memory array units 200a are connected to each other. Each of the local memory array units 200a includes a plurality of memory units 210a. The memory units 210a are connected to each other via the first word line WL and the second word line HWL.

In the second embodiment of the present disclosure (FIGS. 6, 8 and 9), each of the memory units 210a of the local memory array units 200a includes a memory cell 212 and the transpose cell 214a. The memory cell 212 of each of the memory units 210a of the local memory array units 200a of the second embodiment is the same as the memory cell 212 of FIG. 2. The transpose cell 214a includes an input bit line VGBL, an input bit line bar VGBLB, an output bit line HGBL and an output bit line bar HGBLB. Each of the input bit line VGBL and the input bit line bar VGBLB transmits a multi-bit input value, and the transpose cell 214a is controlled by the second word line HWL to generate a multi-bit output value on each of the output bit line HGBL and the output bit line bar HGBLB according to the multi-bit input value multiplied by a weight of the memory cell 212. In detail, the multi-bit input value of the input bit line VGBL is $V_{MSB}$ corresponding to Input<3:2>, and the multi-bit input value of the input bit line bar VGBLB is $V_{LSB}$ corresponding to Input<1:0>. The transpose cell 214a includes a first transpose cell transistor M1, a second transpose cell transistor M2, a third transpose cell transistor M3, a fourth transpose cell transistor M4, a fifth transpose cell transistor M5 and a sixth transpose cell transistor M6. The first transpose cell transistor M1 is connected to the second word line HWL, the output bit line HGBL and the local bit line LBL. The second transpose cell transistor M2 is connected to the second word line HWL, the output bit line bar HGBLB and the local bit line bar LBLB. The third transpose cell transistor M3 is connected to the ground voltage, the input bit line VGBL and a third node. The fourth transpose cell transistor M4 is connected to the ground voltage, the input bit line bar VGBLB and a fourth node. The fifth transpose cell transistor M5 is connected to the third node, the output bit line HGBL and the local bit line LBL. The sixth transpose cell transistor M6 is connected to the fourth node, the output bit line bar HGBLB and the local bit line LBL. In addition, the multi-bit input value is an analog signal. The output bit line HGBL and the output bit line bar HGBLB are extended in a vertical direction (column). The first word line WL, the second word line HWL, the input bit line VGBL and the input bit line bar VGBLB are extended in a horizontal direction (row). Each of the first transpose cell transistor M1, the second transpose cell transistor M2, the third transpose cell transistor M3, the fourth transpose cell transistor M4, the fifth transpose cell transistor M5 and the sixth transpose cell transistor M6 is the NMOS transistor. Table 2 lists the multi-bit input values, the weights and the multi-bit output values of the second type of the transpose cell 214a of FIG. 6. The multi-bit output values can be computed by the multi-bit input values and the weights. The multi-bit input values represent the voltage level ($V_{MSB}$) of the input bit line VGBL and the voltage level ($V_{LSB}$) of the input bit line bar VGBLB, respectively. The multi-bit input values are corresponding to Input<3:2> and Input<1:0>, respectively. Each of the input bit line VGBL and the input bit line bar VGBLB may have fourth voltage levels which are equal to VDD (e.g., 1.0 V), Vinput10 (e.g., 0.7 V), Vinput01 (e.g., 0.5 V) and VSS (0 V), respectively, i.e., each of the multi-bit input values may be VDD, Vinput10, Vinput01 or VSS. The weight is corresponding to the voltage level on the local bit line LBL. The multi-bit output values (i.e., "Input×Weight") are corresponding to currents on the output bit line HGBL and the output bit line bar HGBLB.

TABLE 2

| Input (Input<3:2>/Input<1:0>) | Input (VGBL/VGBLB) | Weight (LBL) | Input × Weight (HGBL/HGBLB) |
| --- | --- | --- | --- |
| 11 | VDD | 1 | 3 × Idis |
| 10 | Vinput10 | | 2 × Idis |
| 01 | Vinput01 | | 1 × Idis |
| 00 | VSS | | 0 |
| Don't care | Don't care | 0 | 0 |

In the third embodiment of the present disclosure (FIGS. 7-9), each of the memory units 210a includes a memory cell 212 and the transpose cell 214b. The memory cell 212 of each of the memory units 210a of the local memory array units 200a of the third embodiment is the same as the memory cell 212 of FIG. 2. The transpose cell 214b includes two input bit lines Input<3>, Input<2>, two input bit line bars Input<1>, Input<0>, an output bit line HGBL and an output bit line bar HGBLB. The two input bit lines Input<3>, Input<2> transmit one multi-bit input value, and the two input bit line bars Input<1>, Input<0> transmit another multi-bit input value. The transpose cell 214b is controlled by the second word line HWL to generate a multi-bit output value on each of the output bit line HGBL and the output bit line bar HGBLB according to the multi-bit input value multiplied by a weight of the memory cell 212. In detail, the multi-bit input value of the two input bit lines Input<3:2> are corresponding to $V_{MSB}$, and the multi-bit input value of the two input bit line bars Input<1:0> are corresponding to $V_{LSB}$. The transpose cell 214b includes a first transpose cell transistor M1, a second transpose cell transistor M2, a third transpose cell transistor M3, a fourth transpose cell transistor M4, a fifth transpose cell transistor M5, a sixth transpose cell transistor M6, a seventh transpose cell transistor M7, an eighth transpose cell transistor M8, a ninth transpose cell transistor M9 and a tenth transpose cell transistor M10. The first transpose cell transistor M1 is connected to the second word line HWL, the output bit line HGBL and the local bit line LBL. The second transpose cell transistor M2 is connected to the second word line HWL, the output bit line bar HGBLB and the local bit line bar LBLB.

The third transpose cell transistor M3 is connected to the output bit line HGBL, the local bit line LBL and a third node. The fourth transpose cell transistor M4 is connected to the third node, one of the input bit lines Input<3> and the ground voltage. The fifth transpose cell transistor M5 is connected to the ground voltage, one of the input bit line bars Input<1> and a fourth node. The sixth transpose cell transistor M6 is connected to the fourth node, the output bit line bar HGBLB and the local bit line LBL. The seventh transpose cell transistor M7 is connected to the output bit line HGBL, the local bit line LBL and a fifth node. The eighth transpose cell transistor M8 is connected to the fifth node, another of the input bit lines Input<2> and the ground voltage. The ninth transpose cell transistor M9 is connected to the ground voltage, another of the input bit line bars Input<0> and a sixth node. The tenth transpose cell transistor M10 is connected to the sixth node, the output bit line bar HGBLB and the local bit line LBL. In addition, the multi-bit input values of the input bit lines Input<3:2> and the input bit line bars Input<1:0> are digital signals. The output bit line HGBL and the output bit line bar HGBLB are extended in the vertical direction. The first word line WL, the second word line HWL, the input bit lines Input<3:2> and the input bit line bars Input<1:0> are extended in the horizontal direction. Each of the third transpose cell transistor M3, the fourth transpose cell transistor M4, the fifth transpose cell transistor M5 and the sixth transpose cell transistor M6 has a first transistor width. Each of the seventh transpose cell transistor M7, the eighth transpose cell transistor M8, the ninth transpose cell transistor M9 and the tenth transpose cell transistor M10 has a second transistor width. The first transistor width is equal to twice the second transistor width. Each of the first transpose cell transistor M1, the second transpose cell transistor M2, the third transpose cell transistor M3, the fourth transpose cell transistor M4, the fifth transpose cell transistor M5, the sixth transpose cell transistor M6, the seventh transpose cell transistor M7, the eighth transpose cell transistor M8, the ninth transpose cell transistor M9 and the tenth transpose cell transistor M10 is the NMOS transistor. Table 3 lists the multi-bit input values, the weights and the multi-bit output values of the third type of the transpose cell 214b of FIG. 7. The multi-bit output values can be computed by the multi-bit input values and the weights. The multi-bit input values represent the voltage levels of the input bit lines Input<3:2> and the voltage levels of the input bit line bars Input<1:0>, respectively. Each of the input bit lines Input<3:2> and the input bit line bars Input<1:0> may have two voltage levels which are equal to VDD (e.g., 1.0 V) and VSS (0 V), respectively, i.e., each of the multi-bit input values may be "11", "10", "01" or "00". The weight is corresponding to the voltage level on the local bit line LBL. The multi-bit output values (i.e., "Input× Weight") are corresponding to currents on the output bit line HGBL and the output bit line bar HGBLB.

TABLE 3

| Input (Input<3:2>/ Input<1:0>) | Input (Input<3>/ Input<1>) | Input (Input<2>/ Input<0>) | Weight (LBL) | Input × Weight (HGBL/HGBLB) |
|---|---|---|---|---|
| 11 | VDD | VDD | 1 | 3 × Idis |
| 10 | VDD | VSS |   | 2 × Idis |
| 01 | VSS | VDD |   | 1 × Idis |
| 00 | VSS | VSS |   | 0 |
| Don't care | Don't care | Don't care | 0 | 0 |

In FIGS. 6, 8 and 9, when each of the local memory array units 200a includes the transpose cell 214a, the word line driver 300a is connected to each of the local memory array units 200a via the first word line WL, the second word line HWL, the input bit line VGBL and the input bit line bar VGBLB. The word line driver 300a is represented by "WLDRV & CIM mode input driver" and is located on a left side of the local memory array units 200a. The word line driver 300a generates the voltage level of the first word line WL, the voltage level of the second word line HWL, the voltage level of the input bit line VGBL and the voltage level of the input bit line bar VGBLB to control each of the local memory array units 200a. In addition, the normal IO circuit 400 is connected to each of the local memory array units 200a via the output bit line HGBL and the output bit line bar HGBLB. The normal IO circuit 400 is located on a bottom side of the local memory array units 200a. The normal IO circuit 400 receives the weights from the local memory array units 200a. Moreover, the CIM readout circuit 600 is connected to each of the local memory array units 200a via the output bit line HGBL and the output bit line bar HGBLB. The CIM readout circuit 600 is located on a top side of the local memory array units 200a. The CIM readout circuit 600 receives the multi-bit output values from the local memory array units 200a. The structure of the CIM readout circuit 600 of FIG. 9 is the same as the CIM readout circuit 600 of FIG. 5. In the normal mode, the word line driver 300a and the normal IO circuit 400 are configured to generate the multi-bit output values, as shown in FIG. 8. In the CIM mode, the word line driver 300a and the CIM readout circuit 600 are configured to generate the multi-bit output values, as shown in FIG. 9.

In FIGS. 7, 8 and 9, when each of the local memory array units 200a includes the transpose cell 214b, the word line driver 300a is connected to each of the local memory array units 200a via the first word line WL, the second word line HWL, the input bit lines Input<3:2> and the input bit line bars Input<1:0>. The word line driver 300a generates the voltage levels of the first word line WL, the second word line HWL, the input bit lines Input<3:2> and the input bit line bars Input<1:0> to control each of the local memory array units 200a. In the normal mode, the word line driver 300a and the normal IO circuit 400 are configured to generate the multi-bit output values, as shown in FIG. 8. In the CIM mode, the word line driver 300a and the CIM readout circuit 600 are configured to generate the multi-bit output values, as shown in FIG. 9. The transpose cell 214a of FIG. 6 or the transpose cell 214b of FIG. 7 can be operated in the memory array structure 100a.

Therefore, the memory unit 210a for multi-bit CNN based CIM applications and the memory array structure 100a for multi-bit CNN based CIM applications of the present disclosure can turn on a large number of word lines at the same time without causing the write disturb issue and decrease threshold voltage variations of SRAM cell.

Figure 11:
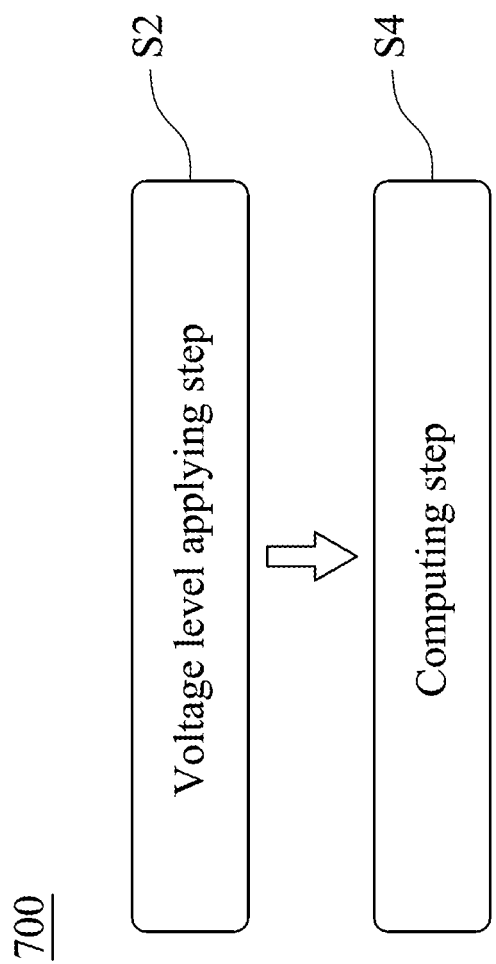
FIG. 11 shows a flow chart of a computing method of a memory array structure for multi-bit convolutional neural network based computing-in-memory applications according to a fourth embodiment of the present disclosure.
Figure 12:
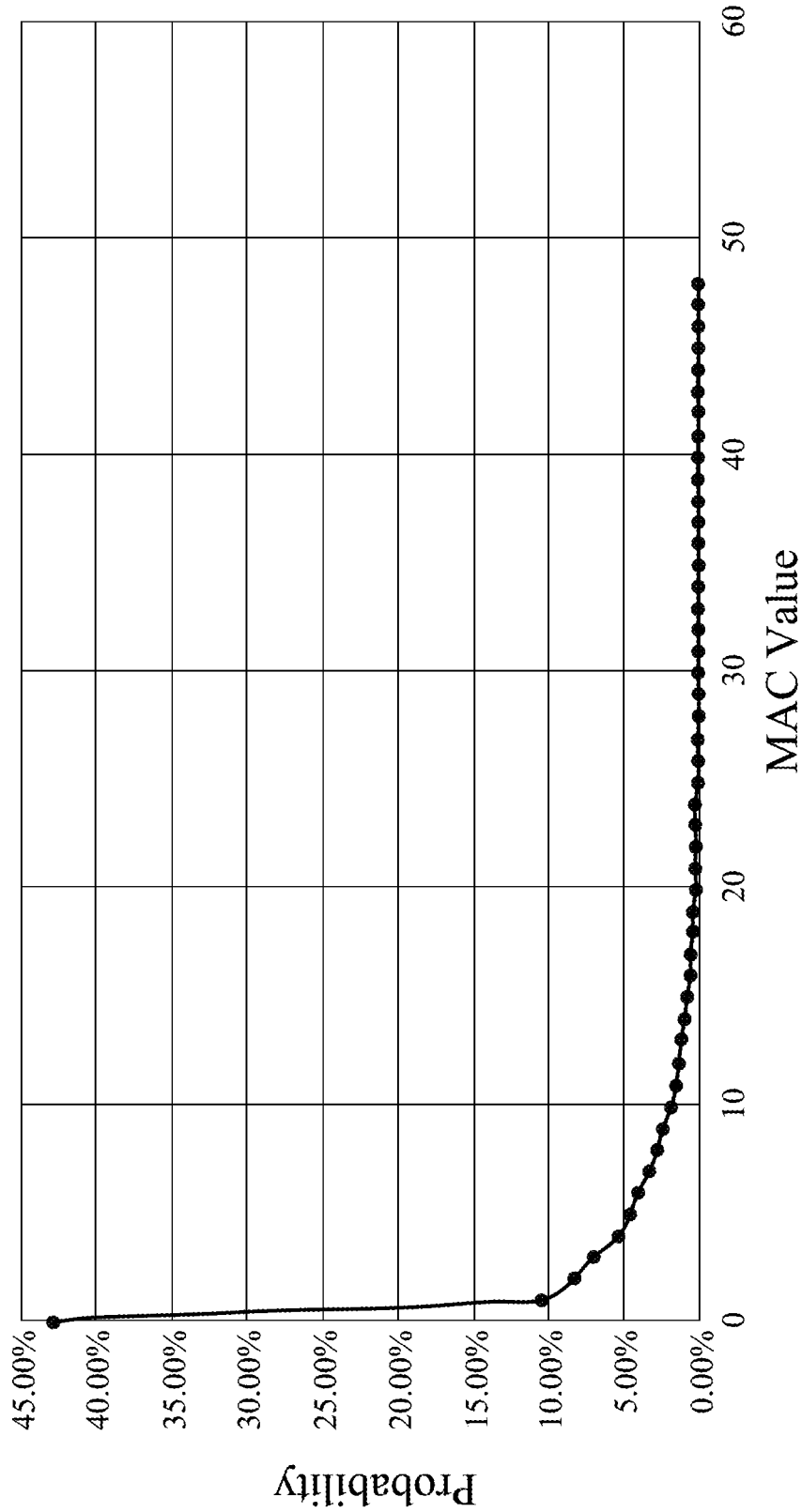
FIG. 12 shows a probability corresponding to MAC values when a dataset is cifar10.
Figure 13:
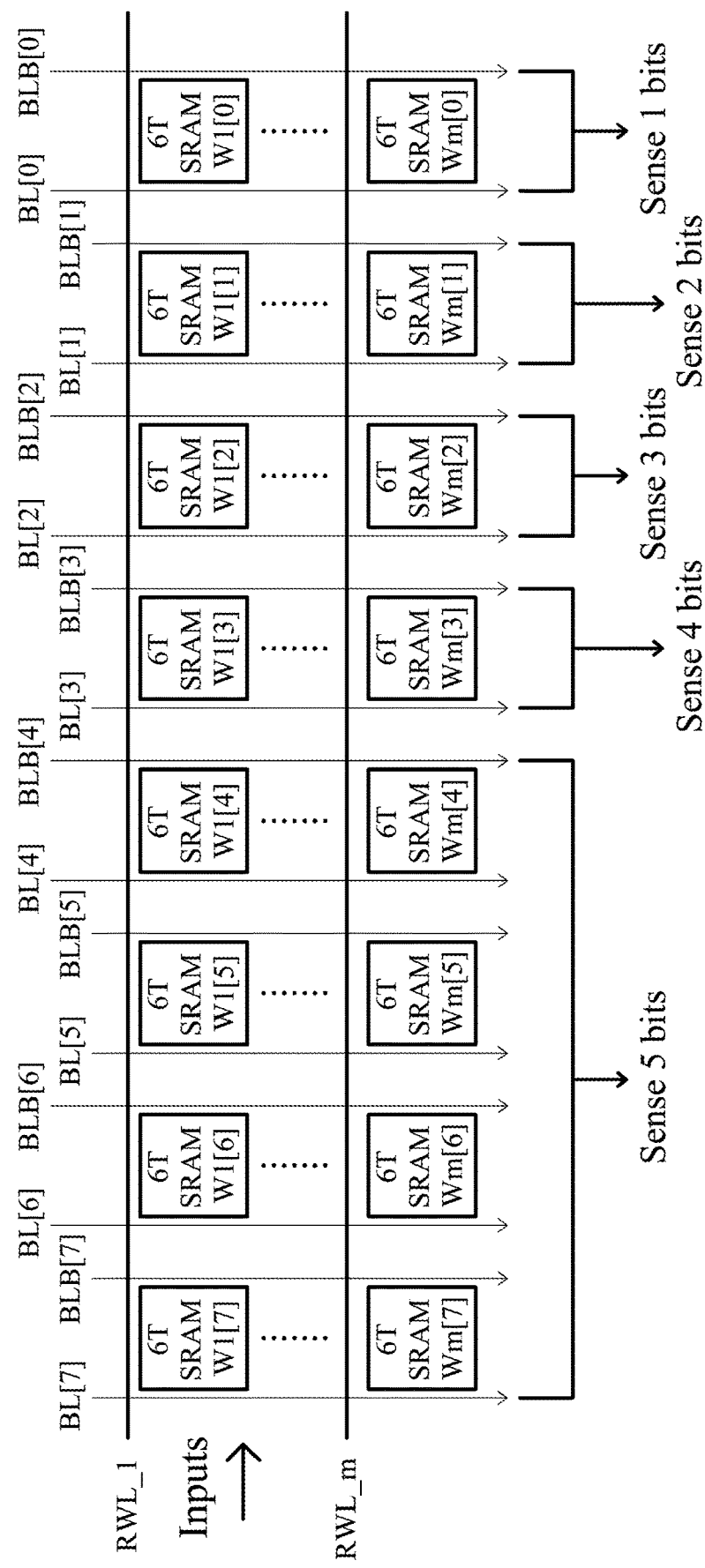
FIG. 13 shows a schematic view of the first type of the memory units of the memory array structure of FIG. 2 when sensing different bits in different columns.

FIG. 11 shows a flow chart of a computing method 700 of a memory array structure 100 for multi-bit CNN based CIM applications according to a fourth embodiment of the present disclosure. FIG. 12 shows a probability corresponding to MAC values when a dataset is cifar10. FIG. 13 shows a schematic view of the first type of the memory units 210 of the memory array structure 100 of FIG. 2 when sensing different bits in different columns. The computing method 700 of the memory array structure 100 for the multi-bit CNN based CIM applications is controlled by a first word line WL and a second word line HWL. The computing method 700 includes a voltage level applying step S2 and a computing step S4.

The voltage level applying step S2 includes applying a plurality of voltage levels to the first word line WL, the second word line HWL, the weight, the at least one input bit line and the at least one input bit line bar of each of the memory units, respectively. In detail, when the transpose cell 214 of FIG. 3 is used in each of the memory units 210, the voltage level applying step S2 includes applying the voltage levels to the first word line WL, the second word line HWL, the weight, the input bit line HGBL and the input bit line bar HGBLB of each of the memory units 210, respectively. When the transpose cell 214a of FIG. 6 is used in each of the memory units 210a, the voltage level applying step S2 includes applying the voltage levels to the first word line WL, the second word line HWL, the weight, the input bit line VGBL and the input bit line bar VGBLB of each of the memory units 210a, respectively. When the transpose cell 214b of FIG. 7 is used in each of the memory units 210a, the voltage level applying step S2 includes applying the voltage levels to the first word line WL, the second word line HWL, the weight, the input bit lines Input<3:2> and the input bit line bars Input<1:0> of each of the memory units 210a, respectively.

The computing step S4 includes driving the transpose cell of each of the memory units to compute the voltage levels of the weight, the at least one input bit line and the at least one input bit line bar so as to generate the multi-bit output value on each of the output bit line and the output bit line bar according to the at least one multi-bit input value multiplied by the weight. The computing step S4 further includes driving each of two sense amplifiers SA of each of the memory units to transfer the multi-bit output value to a multi-bit digital output value (one of SA_OUT[0]-SA_OUT[m]), and driving at least one adder-shifter circuit 610 to add and shift the multi-bit digital output values of the sense amplifiers SA of the memory units to generate at least one multi-bit CIM output signal (CIM_OUT[m:0]). The computing step S4 further includes sensing each of the multi-bit digital output values of the sense amplifiers SA of the memory units with a number of bits. The number of bits of a low-order value of the multi-bit digital output values is less than the number of bits of a high-order value of the multi-bit digital output values. In other words, the computing step S4 is for sensing different bits in different columns. When 16-channel accumulations are performed to generate the MAC values with 4-bit inputs and 8-bit weights, the range of the MAC values is between 0 and 48, and most of the MAC values are small, as shown in FIG. 12. The smaller the weight, the smaller the impact on the MAC value, so that it is not required to sense full precision on the output bit line and the output bit line bar with small weight. Table 4 lists accuracy of the MAC values when sensing different bits in different columns. When sensing 6 bits in each column, accuracy of the MAC values is equal to 92.3. When sensing 5 bits in col[7:4], 4 bits in col[3], 3 bits in col[2], 2 bits in col[1] and 1 bit in col[0], accuracy of the MAC values generated by the circuit shown in FIG. 13 is equal to 92.1. When sensing 5 bits in col[7:5], 4 bits in col[4:3], 3 bits in col[2], 2 bits in col[1] and 1 bit in col[0], accuracy of the MAC values is equal to 91.8. Accordingly, the computing method 700 of the present disclosure can increase sensing margin and save energy (e.g., sensing fewer bits) and area (e.g., reducing the area of reference generators) when sensing different bits in different columns, so that it is suitable for the CIM applications.

TABLE 4

| Data set | Input/Weight bits | Sensing bit(s) in each column | | | | | | | Accuracy |
|---|---|---|---|---|---|---|---|---|---|---|
| cifar10 | 4/8 | 6 col[7] | 6 col[6] | 6 col[5] | 6 col[4] | 6 col[3] | 6 col[2] | 6 col[1] | 6 col[0] | 92.3 |
| cifar10 | 4/8 | 5 col[7] | 5 col[6] | 5 col[5] | 5 col[4] | 4 col[3] | 3 col[2] | 2 col[1] | 1 col[0] | 92.1 |
| cifar10 | 4/8 | 5 col[7] | 5 col[6] | 5 col[5] | 4 col[4] | 4 col[3] | 3 col[2] | 2 col[1] | 1 col[0] | 91.8 |

Figure 14:
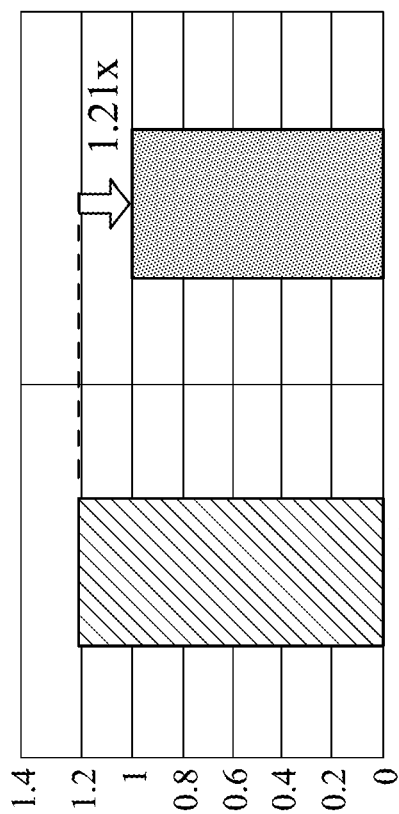
FIG. 14 shows a comparison result of array areas between the memory array structure of the present disclosure and a conventional twin-8T memory array structure.
Figure 15:
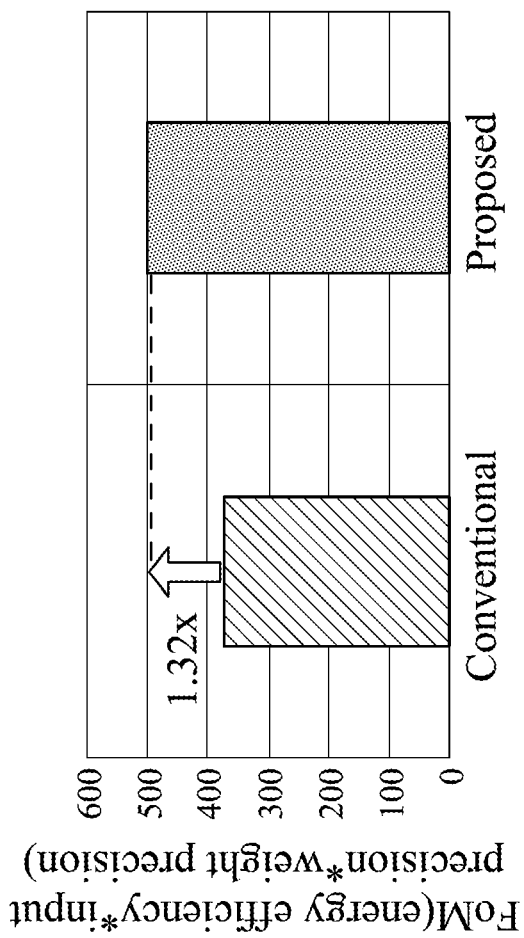
FIG. 15 shows a comparison result of figure of merit (FoM) between the memory array structure of the present disclosure and the conventional twin-8T memory array structure.

FIG. 14 shows a comparison result of array areas between the memory array structure 100 of the present disclosure and a conventional twin-8T memory array structure. FIG. 15 shows a comparison result of figure of merit (FoM) between the memory array structure 100 of the present disclosure and the conventional twin-8T memory array structure. In FIGS. 14 and 15, the memory array structure 100 of the present disclosure achieves a 1.21× decrease in array area, compared to the conventional twin-8T memory array structure. In addition, the memory array structure 100 of the present disclosure achieves a 1.32× increase in FoM, compared to the conventional twin-8T memory array structure.

According to the aforementioned embodiments and examples, the advantages of the present disclosure are described as follows.

1. The memory unit for multi-bit CNN based CIM applications, the memory array structure for multi-bit CNN based CIM applications and the computing method thereof of the present disclosure can turn on a large number of word lines at the same time without causing the write disturb issue and decrease threshold voltage variations of SRAM cell.

2. The memory unit for multi-bit CNN based CIM applications, the memory array structure for multi-bit CNN based CIM applications and the computing method thereof of the present disclosure can increase sensing margin and save energy (e.g., sensing fewer bits) and area (e.g., reducing the area of reference generators) when sensing different bits in different columns, so that it is suitable for the CIM applications.

3. The memory unit for multi-bit CNN based CIM applications, the memory array structure for multi-bit CNN based CIM applications and the computing method thereof of the present disclosure can achieve the 1.21× decrease in array area, compared to the conventional twin-8T memory array structure. In addition, the memory unit for multi-bit CNN based CIM applications, the memory array structure for multi-bit CNN based CIM applications and the computing method thereof of the present disclosure can achieve the 1.32× increase in FoM, compared to the conventional twin-8T memory array structure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory unit for multi-bit convolutional neural network based computing-in-memory applications, which is controlled by a first word line and a second word line, and the memory unit for the multi-bit convolutional neural network based computing-in-memory applications comprising:
    at least one memory cell storing a weight, wherein the at least one memory cell is controlled by the first word line and comprises a local bit line transmitting the weight; and
    a transpose cell connected to the at least one memory cell and receiving the weight via the local bit line, wherein the transpose cell comprises at least one input bit line, at least one input bit line bar, an output bit line and an output bit line bar, each of the at least one input bit line and the at least one input bit line bar transmits at least one multi-bit input value, and the transpose cell is controlled by the second word line to generate a multi-bit output value on each of the output bit line and the output bit line bar according to the at least one multi-bit input value multiplied by the weight.

2. The memory unit for the multi-bit convolutional neural network based computing-in-memory applications of claim 1, wherein the at least one memory cell further comprises:
    a first node storing the weight;
    a second node storing an inverted weight opposite to the weight of the first node;
    a local bit line bar connected to the transpose cell and transmitting the inverted weight to the transpose cell;
    a first memory cell transistor connected to the first node, the local bit line and the first word line;
    a second memory cell transistor connected to the second node, the local bit line bar and the first word line;
    a first inverter located between the first node and the second node; and
    a second inverter connected to the first inverter.

3. The memory unit for the multi-bit convolutional neural network based computing-in-memory applications of claim 2, wherein a number of the at least one input bit line is one, a number of the at least one input bit line bar is one, a number of the at least one multi-bit input value is one, and the transpose cell further comprises:
    a first transpose cell transistor connected to the second word line, the input bit line and the local bit line;
    a second transpose cell transistor connected to the second word line, the input bit line bar and the local bit line bar;
    a third transpose cell transistor connected to a ground voltage, the input bit line and a third node;
    a fourth transpose cell transistor connected to the third node, the local bit line and the output bit line;
    a fifth transpose cell transistor connected to the ground voltage, the input bit line bar and a fourth node; and
    a sixth transpose cell transistor connected to the fourth node, the local bit line and the output bit line bar.

4. The memory unit for the multi-bit convolutional neural network based computing-in-memory applications of claim 3, wherein,
    the multi-bit input value is an analog signal;
    the input bit line and the input bit line bar are extended in a vertical direction; and
    the first word line, the second word line, the output bit line and the output bit line bar are extended in a horizontal direction.

5. The memory unit for the multi-bit convolutional neural network based computing-in-memory applications of claim 2, wherein a number of the at least one input bit line is one, a number of the at least one input bit line bar is one, a number of the at least one multi-bit input value is one, and the transpose cell further comprises:
    a first transpose cell transistor connected to the second word line, the output bit line and the local bit line;
    a second transpose cell transistor connected to the second word line, the output bit line bar and the local bit line bar;
    a third transpose cell transistor connected to a ground voltage, the input bit line and a third node;
    a fourth transpose cell transistor connected to the ground voltage, the input bit line bar and a fourth node;
    a fifth transpose cell transistor connected to the third node, the output bit line and the local bit line; and
    a sixth transpose cell transistor connected to the fourth node, the output bit line bar and the local bit line.

6. The memory unit for the multi-bit convolutional neural network based computing-in-memory applications of claim 5, wherein,
    the multi-bit input value is an analog signal;
    the output bit line and the output bit line bar are extended in a vertical direction; and
    the first word line, the second word line, the input bit line and the input bit line bar are extended in a horizontal direction.

7. The memory unit for the multi-bit convolutional neural network based computing-in-memory applications of claim 2, wherein a number of the at least one input bit line is two, a number of the at least one input bit line bar is two, a number of the at least one multi-bit input value is two, and the transpose cell further comprises:
    a first transpose cell transistor connected to the second word line, the output bit line and the local bit line;
    a second transpose cell transistor connected to the second word line, the output bit line bar and the local bit line bar;
    a third transpose cell transistor connected to the output bit line, the local bit line and a third node;
    a fourth transpose cell transistor connected to the third node, one of the input bit lines and a ground voltage;
    a fifth transpose cell transistor connected to the ground voltage, one of the input bit line bars and a fourth node;
    a sixth transpose cell transistor connected to the fourth node, the output bit line bar and the local bit line;
    a seventh transpose cell transistor connected to the output bit line, the local bit line and a fifth node;
    an eighth transpose cell transistor connected to the fifth node, another of the input bit lines and the ground voltage;
    a ninth transpose cell transistor connected to the ground voltage, another of the input bit line bars and a sixth node; and
    a tenth transpose cell transistor connected to the sixth node, the output bit line bar and the local bit line.

8. The memory unit for the multi-bit convolutional neural network based computing-in-memory applications of claim 7, wherein,
    the multi-bit input values are digital signals;

the output bit line and the output bit line bar are extended in a vertical direction; and the first word line, the second word line, the input bit lines and the input bit line bars are extended in a horizontal direction;

wherein each of the third transpose cell transistor, the fourth transpose cell transistor, the fifth transpose cell transistor and the sixth transpose cell transistor has a first transistor width, and each of the seventh transpose cell transistor, the eighth transpose cell transistor, the ninth transpose cell transistor and the tenth transpose cell transistor has a second transistor width, and the first transistor width is equal to twice the second transistor width.

9. A memory array structure for multi-bit convolutional neural network based computing-in-memory applications, which is controlled by a first word line and a second word line, and the memory array structure for the multi-bit convolutional neural network based computing-in-memory applications comprising:

a plurality of memory units connected to each other via the first word line and the second word line, wherein each of the memory units comprises:

at least one memory cell storing a weight, wherein the at least one memory cell is controlled by the first word line and comprises a local bit line transmitting the weight; and a transpose cell connected to the at least one memory cell and receiving the weight via the local bit line, wherein the transpose cell comprises at least one input bit line, at least one input bit line bar, an output bit line and an output bit line bar, each of the at least one input bit line and the at least one input bit line bar transmits at least one multi-bit input value, and the transpose cell is controlled by the second word line to generate a multi-bit output value on each of the output bit line and the output bit line bar according to the at least one multi-bit input value multiplied by the weight.

10. The memory array structure for the multi-bit convolutional neural network based computing-in-memory applications of claim 9, wherein the at least one memory cell further comprises:

a first node storing the weight;

a second node storing an inverted weight opposite to the weight of the first node;

a local bit line bar connected to the transpose cell and transmitting the inverted weight to the transpose cell;

a first memory cell transistor connected to the first node, the local bit line and the first word line;

a second memory cell transistor connected to the second node, the local bit line bar and the first word line;

a first inverter located between the first node and the second node; and a second inverter connected to the first inverter.

11. The memory array structure for the multi-bit convolutional neural network based computing-in-memory applications of claim 10, wherein a number of the at least one input bit line is one, a number of the at least one input bit line bar is one, a number of the at least one multi-bit input value is one, and the transpose cell further comprises:

a first transpose cell transistor connected to the second word line, the input bit line and the local bit line;

a second transpose cell transistor connected to the second word line, the input bit line bar and the local bit line bar;

a third transpose cell transistor connected to a ground voltage, the input bit line and a third node;

a fourth transpose cell transistor connected to the third node, the local bit line and the output bit line;

a fifth transpose cell transistor connected to the ground voltage, the input bit line bar and a fourth node; and a sixth transpose cell transistor connected to the fourth node, the local bit line and the output bit line bar.

12. The memory array structure for the multi-bit convolutional neural network based computing-in-memory applications of claim 11, wherein, the multi-bit input value is an analog signal;

the input bit line and the input bit line bar are extended in a vertical direction; and the first word line, the second word line, the output bit line and the output bit line bar are extended in a horizontal direction.

13. The memory array structure for the multi-bit convolutional neural network based computing-in-memory applications of claim 10, wherein a number of the at least one input bit line is one, a number of the at least one input bit line bar is one, a number of the at least one multi-bit input value is one, and the transpose cell further comprises:

a first transpose cell transistor connected to the second word line, the output bit line and the local bit line;

a second transpose cell transistor connected to the second word line, the output bit line bar and the local bit line bar;

a third transpose cell transistor connected to a ground voltage, the input bit line and a third node;

a fourth transpose cell transistor connected to the ground voltage, the input bit line bar and a fourth node;

a fifth transpose cell transistor connected to the third node, the output bit line and the local bit line; and a sixth transpose cell transistor connected to the fourth node, the output bit line bar and the local bit line.

14. The memory array structure for the multi-bit convolutional neural network based computing-in-memory applications of claim 13, wherein, the multi-bit input value is an analog signal;

the output bit line and the output bit line bar are extended in a vertical direction; and the first word line, the second word line, the input bit line and the input bit line bar are extended in a horizontal direction.

15. The memory array structure for the multi-bit convolutional neural network based computing-in-memory applications of claim 10, wherein a number of the at least one input bit line is two, a number of the at least one input bit line bar is two, a number of the at least one multi-bit input value is two, and the transpose cell further comprises:

a first transpose cell transistor connected to the second word line, the output bit line and the local bit line;

a second transpose cell transistor connected to the second word line, the output bit line bar and the local bit line bar;

a third transpose cell transistor connected to the output bit line, the local bit line and a third node;

a fourth transpose cell transistor connected to the third node, one of the input bit lines and a ground voltage;

a fifth transpose cell transistor connected to the ground voltage, one of the input bit line bars and a fourth node;

a sixth transpose cell transistor connected to the fourth node, the output bit line bar and the local bit line;

a seventh transpose cell transistor connected to the output bit line, the local bit line and a fifth node;

an eighth transpose cell transistor connected to the fifth node, another of the input bit lines and the ground voltage;
a ninth transpose cell transistor connected to the ground voltage, another of the input bit line bars and a sixth node; and
a tenth transpose cell transistor connected to the sixth node, the output bit line bar and the local bit line.

16. The memory array structure for the multi-bit convolutional neural network based computing-in-memory applications of claim 15, wherein,
the multi-bit input values are digital signals;
the output bit line and the output bit line bar are extended in a vertical direction; and
the first word line, the second word line, the input bit lines and the input bit line bars are extended in a horizontal direction;
wherein each of the third transpose cell transistor, the fourth transpose cell transistor, the fifth transpose cell transistor and the sixth transpose cell transistor has a first transistor width, and each of the seventh transpose cell transistor, the eighth transpose cell transistor, the ninth transpose cell transistor and the tenth transpose cell transistor has a second transistor width, and the first transistor width is equal to twice the second transistor width.

17. The memory array structure for the multi-bit convolutional neural network based computing-in-memory applications of claim 9, further comprising:
a computing-in-memory readout circuit connected to the local memory array units and comprising:
a plurality of sense amplifiers connected to the output bit line and the output bit line bar, wherein each of the sense amplifiers receives the multi-bit output value from one of the output bit line and the output bit line bar, and each of the sense amplifiers transfers the multi-bit output value to a multi-bit digital output value; and
at least one adder-shifter circuit connected to the sense amplifiers, wherein the at least one adder-shifter circuit is configured to add and shift the multi-bit digital output values of the sense amplifiers to generate at least one multi-bit computing-in-memory output signal.

18. A computing method of the memory array structure for the multi-bit convolutional neural network based computing-in-memory applications of claim 9, which is controlled by the first word line and the second word line, and the computing method comprising:
providing a voltage level applying step, wherein the voltage level applying step comprises applying a plurality of voltage levels to the first word line, the second word line, the weight, the at least one input bit line and the at least one input bit line bar of each of the memory units, respectively; and
providing a computing step, wherein the computing step comprises driving the transpose cell of each of the memory units to compute the voltage levels of the weight, the at least one input bit line and the at least one input bit line bar so as to generate the multi-bit output value on each of the output bit line and the output bit line bar according to the at least one multi-bit input value multiplied by the weight.

19. The computing method of claim 18, wherein the computing step further comprises:
driving each of two sense amplifiers of each of the memory units to transfer the multi-bit output value to a multi-bit digital output value; and
driving at least one adder-shifter circuit to add and shift the multi-bit digital output values of the sense amplifiers of the memory units to generate at least one multi-bit computing-in-memory output signal.

20. The computing method of claim 19, wherein the computing step further comprises:
sensing each of the multi-bit digital output values of the sense amplifiers of the memory units with a number of bits;
wherein the number of bits of a low-order value of the multi-bit digital output values is less than the number of bits of a high-order value of the multi-bit digital output values.

* * * * *